United States Patent
Hegde et al.

(10) Patent No.: US 12,109,909 B2
(45) Date of Patent: Oct. 8, 2024

(54) GOAL-BASED ELECTRIC VEHICLE CHARGING

(71) Applicant: GM Global Technology Operations LLC, Detroit, MI (US)

(72) Inventors: Bharatkumar Hegde, Bloomfield Hills, MI (US); Ibrahim Haskara, Macomb, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 268 days.

(21) Appl. No.: 17/885,698

(22) Filed: Aug. 11, 2022

(65) Prior Publication Data
US 2024/0051428 A1    Feb. 15, 2024

(51) Int. Cl.
*B60L 58/12* (2019.01)
*B60L 53/62* (2019.01)
*B60L 58/16* (2019.01)
*B60L 58/18* (2019.01)
*G01C 21/34* (2006.01)
*G01R 31/3835* (2019.01)

(52) U.S. Cl.
CPC .............. *B60L 58/12* (2019.02); *B60L 53/62* (2019.02); *B60L 58/16* (2019.02); *B60L 58/18* (2019.02); *G01C 21/3407* (2013.01); *G01R 31/3835* (2019.01)

(58) Field of Classification Search
CPC .......... B60L 58/12; B60L 53/62; B60L 58/16; B60L 58/18; B60L 53/00; B60L 3/12; B60L 2260/54; G01C 21/3407; G01C 21/3608; G01R 31/3835; G01R 31/392; H02J 7/00
See application file for complete search history.

(56) References Cited

U.S. PATENT DOCUMENTS

| | | | | |
|---|---|---|---|---|
| 11,332,038 | B1* | 5/2022 | Wang | B60L 50/60 |
| 11,945,334 | B2* | 4/2024 | Bock | B60L 58/25 |
| 2018/0201142 | A1* | 7/2018 | Galin | H02J 3/14 |

FOREIGN PATENT DOCUMENTS

| | | | | |
|---|---|---|---|---|
| CN | 102844957 A | * | 12/2012 | B60L 50/50 |
| CN | 110103773 A | * | 8/2019 | |

(Continued)

OTHER PUBLICATIONS

CN-112277729-A (Year: 2019).*

(Continued)

*Primary Examiner* — Frederick M Brushaber
(74) *Attorney, Agent, or Firm* — CANTOR COLBURN LLP

(57) ABSTRACT

A system in a vehicle includes memory to store driving history and charging history of the vehicle. The system also includes a processor to obtain a predicted battery life of one or more battery packs of the vehicle based on the driving history and the charging history, obtain a targeted battery life of a user indicating a mileage goal for a specific charge capacity of the one or more battery packs, and determine a difference between the predicted battery life and the targeted battery life. The processor solves an optimization problem to determine a future charging strategy to achieve the targeted battery life and controls an onboard charging system or an external charger based on the future charging strategy or controls routing or navigation based on the future charging strategy.

20 Claims, 2 Drawing Sheets

(56) References Cited

FOREIGN PATENT DOCUMENTS

| CN | 112277729 | A | * | 1/2021 | ............ B60L 58/12 |
| CN | 112881917 | A | * | 6/2021 | ........... G01R 31/367 |
| JP | 2021505911 | A | * | 2/2021 | |

OTHER PUBLICATIONS

CN-112881917-A (Year: 2021).*
CN-102844958-A (Year: 2010).*
CN-110103773-A (Year: 2019).*
JP-2021505911-A (Year: 2019).*

* cited by examiner

GOAL-BASED ELECTRIC VEHICLE CHARGING

INTRODUCTION

The subject disclosure relates to goal-based electric vehicle charging.

Electric vehicles (e.g., automobiles, trucks, construction equipment, farm equipment, automated factory equipment) use one or more battery packs for propulsion. An electric vehicle (EV) requires recharging of the battery packs, just as internal combustion and hybrid vehicles require refueling. Recharging may be performed using a level 1 charger (e.g., 120 volt (V)) or a level 2 charger (e.g., 240 V), both of which supply alternating current (AC), or using a level 3 charger, which is a direct current fast charger (DCFC) (e.g., 400-900V) that supplies DC. Each type of charger requires a different duration for charging and has a different impact on battery life. Accordingly, it is desirable to provide goal-based electric vehicle charging.

SUMMARY

In one exemplary embodiment, a system in a vehicle includes memory to store driving history and charging history of the vehicle. The system also includes a processor to obtain a predicted battery life of one or more battery packs of the vehicle based on the driving history and the charging history, obtain a targeted battery life of a user indicating a mileage goal for a specific charge capacity of the one or more battery packs, and determine a difference between the predicted battery life and the targeted battery life. The processor solves an optimization problem to determine a future charging strategy to achieve the targeted battery life and controls an onboard charging system or an external charger based on the future charging strategy or controls routing or navigation based on the future charging strategy.

In addition to one or more of the features described herein, the processor obtains the predicted battery life using a physics-based or empirical aging model.

In addition to one or more of the features described herein, the processor obtains the predicted battery life based additionally on historical and current environmental conditions, including temperature, during use of the vehicle.

In addition to one or more of the features described herein, the processor obtains the predicted battery life based additionally on historical and current parameters of the one or more battery packs, including voltage, during use of the vehicle.

In addition to one or more of the features described herein, the processor obtains the targeted battery life based on selection of a mode by the user.

In addition to one or more of the features described herein, the processor sets up the optimization problem with constraints including a constraint that a battery life, which indicates a charge capacity of the one or more battery packs, after a number of charges estimated to reach the mileage goal must exceed a battery life at an end of life of the one or more battery packs.

In addition to one or more of the features described herein, the processor solves the optimization problem using dynamic programming or a stochastic search.

In addition to one or more of the features described herein, the processor controls a duration of charging, a type of charging, or a charging profile by the onboard charging system based on the future charging strategy.

In addition to one or more of the features described herein, the processor controls a duration of charging, a type of charging, or a charging profile by the external charger based on the future charging strategy.

In addition to one or more of the features described herein, the processor determines routing or navigation that facilitates a duration of charging indicated by the future charging strategy.

In another exemplary embodiment, a controller includes a non-transitory computer-readable medium storing instructions that, when processed by one or more processors of the controller, implement a method in a vehicle. The method includes storing driving history and charging history of the vehicle, obtaining a predicted battery life of one or more battery packs of the vehicle based on the driving history and the charging history, obtaining a targeted battery life of a user indicating a mileage goal for a specific charge capacity of the one or more battery packs, and determining a difference between the predicted battery life and the targeted battery life. The method also includes solving an optimization problem to determine a future charging strategy to achieve the targeted battery life, and controlling an onboard charging system or an external charger based on the future charging strategy or controlling routing or navigation based on the future charging strategy.

In addition to one or more of the features described herein, the obtaining the predicted battery life includes using a physics-based or empirical aging model.

In addition to one or more of the features described herein, the obtaining the predicted battery life is based additionally on historical and current environmental conditions, including temperature, during use of the vehicle.

In addition to one or more of the features described herein, the obtaining the predicted battery life is based additionally on historical and current parameters of the one or more battery packs, including voltage, during use of the vehicle.

In addition to one or more of the features described herein, the obtaining the targeted battery life is based on selection of a mode by the user.

In addition to one or more of the features described herein, the method also includes setting up the optimization problem with constraints including a constraint that a battery life, which indicates a charge capacity of the one or more battery packs, after a number of charges estimated to reach the mileage goal must exceed a battery life at an end of life of the one or more battery packs.

In addition to one or more of the features described herein, the method also includes solving the optimization problem using dynamic programming or a stochastic search.

In addition to one or more of the features described herein, the method also includes controlling a duration of charging, a type of charging, or a charging profile implemented by the onboard charging system based on the future charging strategy.

In addition to one or more of the features described herein, the method also includes controlling a duration of charging, a type of charging, or a charging profile implemented by the external charger based on the future charging strategy.

In addition to one or more of the features described herein, the controlling the routing or navigation includes determining the routing or navigation that facilitates a duration of charging indicated by the future charging strategy.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
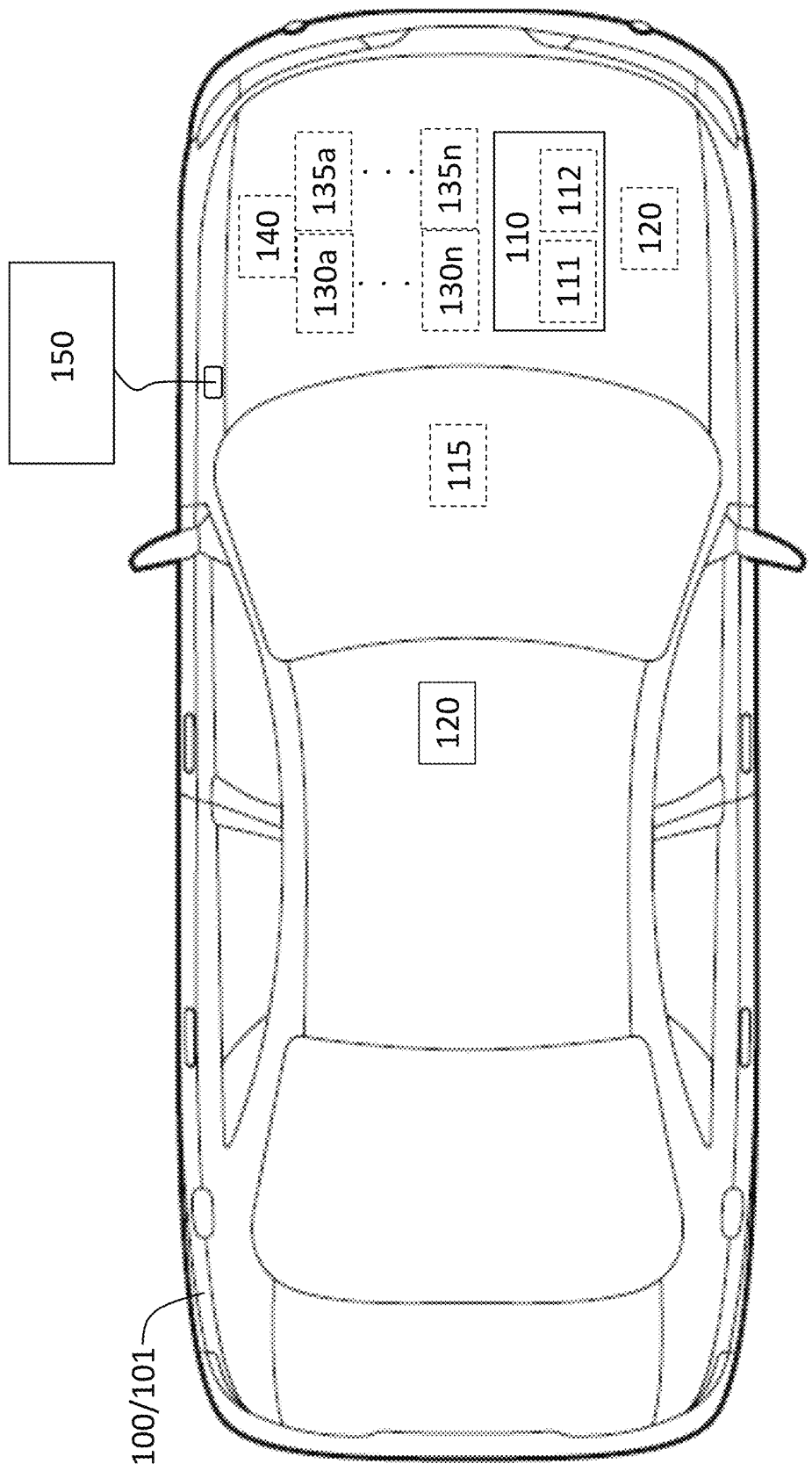
FIG. 1 is a block diagram of a vehicle subject to goal-based charging according to one or more embodiments.

The following description is merely exemplary in nature and is not intended to limit the present disclosure, its application or uses. It should be understood that throughout the drawings, corresponding reference numerals indicate like or corresponding parts and features.

Embodiments of the systems and methods detailed herein relate to goal-based electric vehicle charging. As previously noted, the battery packs of an EV may be recharged using a level 1, level 2, or level 3 (or DCFC) charging system. Recharging with a level 1 charger is relatively the slowest but also has the least impact on battery life. On the other hand, recharging with a DCFC (i.e., level 3 charger) is relatively the fastest but has a greater impact on battery life. According to one or more embodiments, battery driving and charging history and other data are used to predict battery life (e.g., a mileage at which charge capacity of the battery packs is reduced to a certain percentage).

In addition, a vehicle user may indicate a targeted battery life (i.e., the minimum mileage at which the user hopes that reduction to the certain charge capacity percentage occurs). For example, the targeted battery life may be 80 percent at 100,000 miles, meaning that the battery packs can hold 80 percent of their maximum charge when the vehicle has operated for 100,000 miles. Based on a comparison of the predicted battery life and the targeted battery life, future charging recommendations may be provided, and future charging may be controlled.

In accordance with an exemplary embodiment, FIG. 1 is a block diagram of a vehicle 100 subject to goal-based charging. The exemplary vehicle 100 in FIG. 1 is an electric vehicle with one or more battery packs 130a through 130n (generally referred to as 130) and, more specifically, an automobile 101. Each of the battery packs 130a through 130n includes a plurality of batteries or battery cells that are managed by a corresponding battery management system (BMS) 135a through 135n (generally referred to as 135). The battery pack 130 and associated BMS 135 may be referred to together as a smart battery pack. The battery packs 130 may be recharged via an onboard charger (OBC) 140 or an external charger 150. The external charger 150 may be a level 1, level 2, or level 3 charger.

The vehicle 100 may include a number of sensors 120 that obtain information about the vehicle 100 and the environment around the vehicle 100. For example, sensors 120 may include lidar systems, radar systems, and cameras that provide information about the objects and environment around the vehicle 100 and sensors 120 may also include the inertial measurement unit (IMU), steering angle sensor, and other known devices that provide information about the vehicle 100 itself.

The vehicle 100 is also shown with a controller 110. The controller 110 may control various aspects of operation of the vehicle 100. The controller 110 may also obtain input from a vehicle occupant (referred to as a user of the vehicle 100) or provide information to the user via an infotainment system 115. According to one or more embodiments, the controller 110 may obtain information from the various sensors 120 and the BMSs 135 to determine a predicted battery life for the battery packs 130 and to obtain input from the user to determine the targeted battery life (i.e., a desired goal for the battery life). Based on a difference between the two, the controller 110 may then provide information to the user and/or control charging of the battery pack 130 via an OBC 140 or external charger 150 to achieve the targeted battery life.

The controller 110 may include processing circuitry that may include an application specific integrated circuit (ASIC), an electronic circuit, a processor 111 (shared, dedicated, or group) and memory 112 that executes one or more software or firmware programs, a combinational logic circuit, and/or other suitable components that provide the described functionality. The memory of the controller 110 may include a non-transitory computer readable medium that stores instructions which, when processed by one or more of the processors, implement processes discussed herein.

Figure 2:
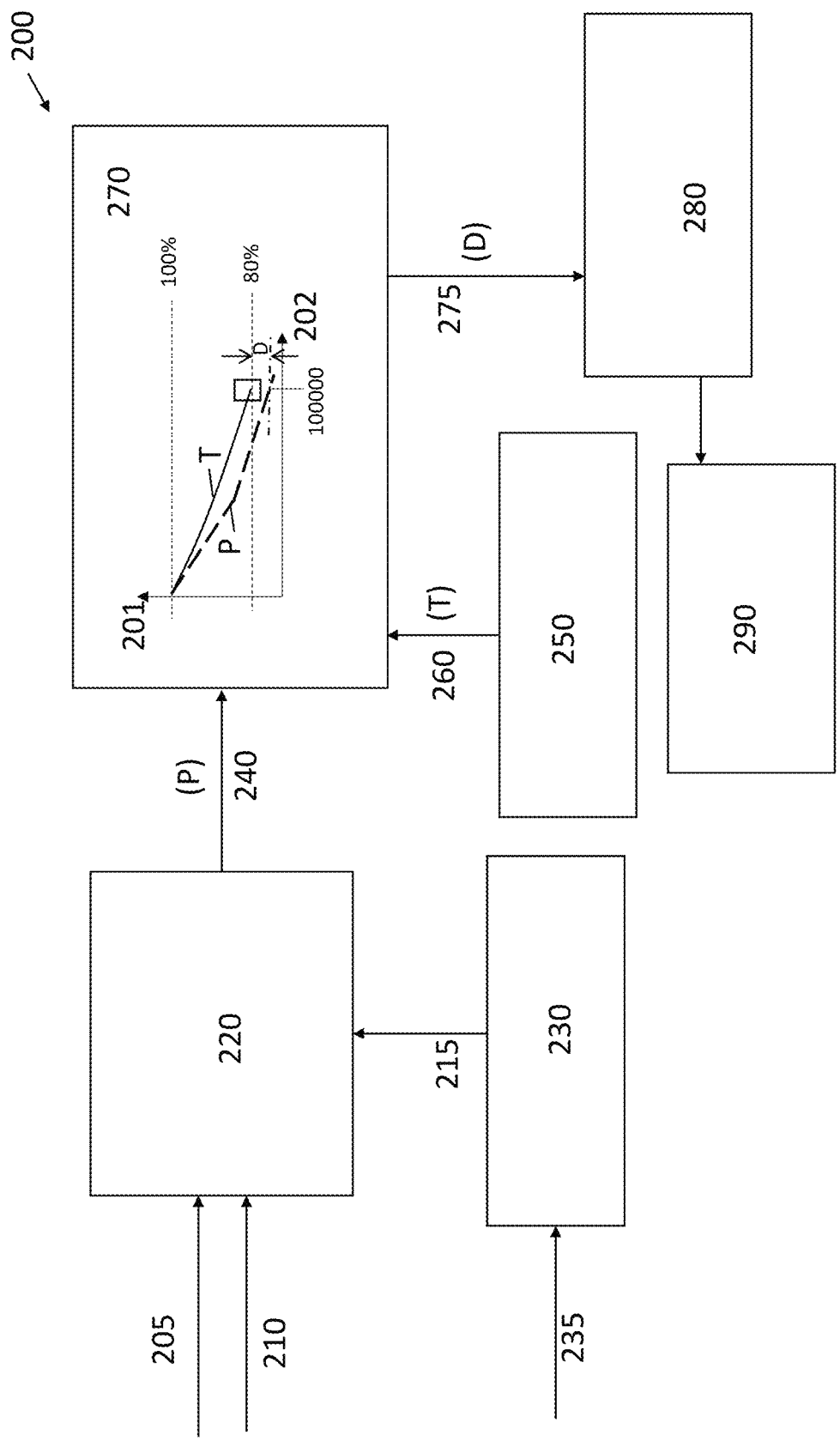
FIG. 2 is a process flow of a method of performing goal-based electric vehicle charging according to one or more embodiments.

FIG. 2 is a process flow of a method 200 of performing goal-based electric vehicle charging according to one or more embodiments. The processes of the method 200 may be implemented by the controller 110, for example. Generally, implementing a known battery capacity fade model, at block 220, results in a predicted battery life (P) 240 and obtaining a user selection, at block 250, results in a targeted battery life (T) 260 (i.e., a battery life goal). The difference (D) 275 between these is determined at block 270 and, as discussed with reference to blocks 280 and 290, recommendations may be provided and control of subsequent charging may be implemented to achieve the targeted battery life (T) 260. Additionally or alternately, routing or navigation may be controlled to accommodate the charging strategy that is developed. Each of the processes is further detailed.

As previously noted, a battery capacity fade model, implemented at block 220, is known and is a physics-based or empirical aging model that predicts capacity fade (i.e., reduction in charge capacity) based on temperature and discharge rate. Thus, typical inputs to the battery capacity fade model include environmental conditions 205 (e.g., temperature, location, season (time of year)) that the vehicle 100 and, more specifically, the battery packs 130 have been subjected to and battery pack parameters 210 (e.g., voltage, capacity, energy, power). Both historical trends and current values of environmental conditions 205 and battery pack parameters 210 may be input to the battery capacity fade model (at block 220).

According to one or more embodiments, an additional input to the battery capacity fade model, implemented at block 220, is based on driving history data 235 for the specific vehicle 100. The driving history data 235 reflects driver behavior and includes driving history and charging history that may be stored in the memory 112 of the controller 110, for example. Driving history may include, for example, acceleration and deceleration rates, highway driving duration, city driving duration (which provides regenerative charging opportunities), and a typical speed trajectory. Charging history may include, for example, depth of discharge (DoD) (i.e., percentage of discharge relative to overall capacity) at the start of charging, type of charging (e.g., level 1, level 2, level 3), and temperature, which may be affected by charging outdoors versus in a garage, at night or during the day, the location, and the season.

Abstracting the driving history data 235, at block 230, results in driving history 215 that may additionally be input to the battery capacity fade model, implemented at block 220, to obtain the predicted battery life (P) 240. Abstracting, at block 230, refers to extracting the environmental conditions 205 and battery pack parameters 210 (e.g., temperature and battery expenditure) associated with the driving history data 235 to provide vehicle-specific input for implementation of the battery capacity fade model at block 220.

At block 250, obtaining a user selection (e.g., via the infotainment system 115) may refer to a mode selection by the user. Exemplary modes may include a fast charging mode, which indicates a desire to maximize charging via DCFC while obtaining a standard targeted battery life (e.g., 80 percent charge capacity at 100,000 miles) or a battery longevity mode, which indicates a desire to extend the mileage range of the battery pack 130 (e.g., targeted battery life of 80 percent charge capacity at 150,000 miles). Additional or alternate modes may be selected, or other input may be provided by the user to indicate a battery life goal that is or results in the targeted battery life (T) 260.

FIG. 2 shows an exemplary predicted battery life (P) 240 and an exemplary targeted battery life (T) 260 plotted with mileage indicated on one axis 202 and battery charge capacity indicated on a perpendicular axis 201. Both the predicted battery life (P) 240 and the targeted battery life (T) 260 indicate that battery charge capacity decreases as mileage increases. In the exemplary case, the user may select fast charging mode and the fast charging mode may correspond with a desire to maximize charging via a level 3 charger while obtaining a standard targeted battery life that is defined as 80 percent charge capacity at 100,000 miles.

This goal is indicated as a box at 100,000 miles and 80 percent (%) battery charge capacity. Additionally in the exemplary case, the driving history data 235 may include a charging history that indicates that level 3 charging is used primarily. At block 270, a difference (D) 275 may be determined between the exemplary predicted battery life (P) 240 and the exemplary targeted battery life (T) 260. This difference (D) 275 that must be addressed in order to achieve the targeted battery life 260 (i.e., the battery capacity goal selected by the user).

At block 280, solving an optimization problem results in a future charging strategy to achieve the battery life goal expressed as the targeted battery life (T) 260. Charging strategy may include the type of charge (e.g., level 1, level 2, or level 3), the duration of charge, and the charging profile (i.e., the specific charge level over the duration of charge). As a result of solving the optimization problem at block 280, future charging may be controlled and/or a charging strategy may be recommended at block 290. That is, at block 290, the controller 110 may directly control charging based on a result of the optimization at block 280 according to exemplary embodiments. According to additional or alternate embodiments, the result of the optimization at block 280 may be provided in the form of recommendations to the user. The user may then select a charging mode that, in turn, controls the subsequent charging of the battery packs 130.

The optimization (at block 280) may be implemented as dynamic programming or a stochastic search (e.g., Monte Carlo simulations), for example. The optimization problem solved at block 280 may be stated as follows:

$$\max J = (\Sigma_{k=0}^{N} w_1 u_{L3}(k)) + w_2 Q_{batt}(N) \quad [\text{EQ. 1}]$$

Battery life is represented by J. At each value of k, from 0 to the number of charges N in the planned life of the battery packs 130. That is, N is given by:

$$N = \frac{(D_{lifetime} - D_{ODO})}{\overline{D}} \quad [\text{EQ. 2}]$$

In EQ. 2, $D_{lifetime}$ refers to the targeted mileage (e.g., 100,000 miles), $D_{ODO}$ refers to the current mileage indicated by the odometer, and $\overline{D}$ is the historical average mileage driven between charges. The parameter $u_{L3}(k)$ refers to charging with a level 3 charger. That is, $u_{L3}(1)$ may be 0 (i.e., not using level 3 charging) and $u_{L3}(5)$ may be 1 (i.e., using level 3 charging). Each parameter $u_{L3}$ may be given by:

$$u_{L3} = u_{driving}(T, \ldots) + u_{L3}(SOC_{start}, T) \quad [\text{EQ. 3}]$$

In EQ. 3, $u_{driving}$ refers to the battery capacity loss due to typical driving of the specific vehicle 100 (e.g., temperature (T), acceleration rate, and any other factors. The capacity fade model may provide this information. The second parameter in EQ. 3 includes the state of charge (SoC) at the start of charging with a level 3 charger.

Weighting factors $w_1$ and $w_2$ are optimized, and the battery life parameter $Q_{batt}(N)$ is given by:

$$Q_{batt}(k+1) = Q_{batt}(k) - f(u(k), k) \quad [\text{EQ. 4}]$$

In EQ. 4, u is the set $\{u_{L1}, u_{L2}, u_{L3}\}$. That is, each u(k) refers to charging via a level 1 (L1), level 2 (L2), or level 3 (L3) charger. Thus, according to EQ. 4, the battery life after each charge is the battery life after the previous charge less a value that is a function of the type of current charge. Another constraint on the optimization problem is the following:

$$Q_{batt}(N) \geq Q_{batt,EOL} \quad [\text{EQ. 5}]$$

That is, the battery capacity after N charges must exceed the end of life (EOL) battery capacity of the battery packs 130.

As previously noted, once the optimization problem is set up, it may be solved, for example, via dynamic programming or a stochastic search. The stochastic search may involve Monte Carlo simulations of charging the one or more battery packs 130 using the level 1, level 2, and level 3 chargers different numbers of times over the course of N charges.

At block 290, the processes may include directly (i.e., automatically) controlling charging via the OBC 140 or external charger 150 based on the optimization result obtained at block 280. This may involve communication between the controller 110 and the OBC 140 or external charger 150 to control the charging speed based on the fact that increased speed is more detrimental to battery life. If the result from block 280 indicates that level 3 charging must be done infrequently, for example, the controller 110 may also control the routing (in an autonomous vehicle) or navigation to plan stops at appropriate (e.g., slower) chargers and also account for the longer charge times. At block 290, the processes may additionally or alternately include providing information to a user (e.g., driver) regarding charging recommendations to achieve the battery life goal (i.e., targeted battery life 260. Based on the recommendations, the user may select a charging mode or otherwise indicate how charging should be controlled to comply with the recommendations.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof. Additionally, the recitation of "or" is intended to convey any combination of the elements listed in the alternative.

What is claimed is:

1. A system in a vehicle comprising:
   memory configured to store driving history and charging history of the vehicle; and
   a processor configured to obtain a predicted battery life of one or more battery packs of the vehicle based on the driving history and the charging history, to obtain a targeted battery life of a user indicating a mileage goal for a specific charge capacity of the one or more battery packs, to determine a difference between the predicted battery life and the targeted battery life, to solve an optimization problem to determine a future charging strategy to achieve the targeted battery life, and to control an onboard charging system or an external charger based on the future charging strategy or to control routing or navigation based on the future charging strategy.

2. The system according to claim 1, wherein the processor is configured to obtain the predicted battery life using a physics-based or empirical aging model.

3. The system according to claim 1, wherein the processor is configured to obtain the predicted battery life based additionally on historical and current environmental conditions, including temperature, during use of the vehicle.

4. The system according to claim 1, wherein the processor is configured to obtain the predicted battery life based additionally on historical and current parameters of the one or more battery packs, including voltage, during use of the vehicle.

5. The system according to claim 1, wherein the processor is configured to obtain the targeted battery life based on selection of a mode by the user.

6. The system according to claim 1, wherein the processor is configured to set up the optimization problem with constraints including a constraint that a battery life, which indicates a charge capacity of the one or more battery packs, after a number of charges estimated to reach the mileage goal must exceed a battery life at an end of life of the one or more battery packs.

7. The system according to claim 6, wherein the processor is configured to solve the optimization problem using dynamic programming or a stochastic search.

8. The system according to claim 1, wherein the processor is configured to control a duration of charging, a type of charging, or a charging profile by the onboard charging system based on the future charging strategy.

9. The system according to claim 1, wherein the processor is configured to control a duration of charging, a type of charging, or a charging profile by the external charger based on the future charging strategy.

10. The system according to claim 1, wherein the processor is configured to determine routing or navigation that facilitates a duration of charging indicated by the future charging strategy.

11. A controller including a non-transitory computer-readable medium storing instructions that, when processed by one or more processors of the controller, implement a method in a vehicle, the method comprising:
    storing driving history and charging history of the vehicle;
    obtaining a predicted battery life of one or more battery packs of the vehicle based on the driving history and the charging history;
    obtaining a targeted battery life of a user indicating a mileage goal for a specific charge capacity of the one or more battery packs;
    determining a difference between the predicted battery life and the targeted battery life;
    solving an optimization problem to determine a future charging strategy to achieve the targeted battery life; and
    controlling an onboard charging system or an external charger based on the future charging strategy or controlling routing or navigation based on the future charging strategy.

12. The method according to claim 11, wherein the obtaining the predicted battery life includes using a physics-based or empirical aging model.

13. The method according to claim 11, wherein the obtaining the predicted battery life is based additionally on historical and current environmental conditions, including temperature, during use of the vehicle.

14. The method according to claim 11, wherein the obtaining the predicted battery life is based additionally on historical and current parameters of the one or more battery packs, including voltage, during use of the vehicle.

15. The method according to claim 11, wherein the obtaining the targeted battery life is based on selection of a mode by the user.

16. The method according to claim 11, further comprising setting up the optimization problem with constraints including a constraint that a battery life, which indicates a charge capacity of the one or more battery packs, after a number of charges estimated to reach the mileage goal must exceed a battery life at an end of life of the one or more battery packs.

17. The method according to claim 16, further comprising solving the optimization problem using dynamic programming or a stochastic search.

18. The method according to claim 11, further comprising controlling a duration of charging, a type of charging, or a charging profile implemented by the onboard charging system based on the future charging strategy.

19. The method according to claim 11, further comprising controlling a duration of charging, a type of charging, or a charging profile implemented by the external charger based on the future charging strategy.

20. The method according to claim 11, wherein the controlling the routing or navigation includes determining the routing or navigation that facilitates a duration of charging indicated by the future charging strategy.

* * * * *